US010224205B2

(12) United States Patent
Sun

(10) Patent No.: US 10,224,205 B2
(45) Date of Patent: Mar. 5, 2019

(54) METHOD FOR PREPARING GRAPHENE, THIN-FILM TRANSISTOR, ARRAY SUBSTRATE, AND DISPLAY PANEL

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 14/316,220

(22) Filed: Jun. 26, 2014

(65) Prior Publication Data

US 2015/0270406 A1 Sep. 24, 2015

(30) Foreign Application Priority Data

Mar. 21, 2014 (CN) .......................... 2014 1 0108434

(51) Int. Cl.
*H01L 21/02* (2006.01)
*H01L 29/16* (2006.01)
(Continued)

(52) U.S. Cl.
CPC .......... *H01L 21/268* (2013.01); *C01B 32/184* (2017.08); *H01L 21/02527* (2013.01);
(Continued)

(58) Field of Classification Search
CPC . H01L 21/268; H01L 29/45; H01L 29/78633; H01L 29/66742;
(Continued)

(56) References Cited

U.S. PATENT DOCUMENTS

2012/0003438 A1* 1/2012 Appleton ................ H01L 29/16
428/195.1
2012/0168724 A1* 7/2012 Park .................... H01L 21/8258
257/29

(Continued)

FOREIGN PATENT DOCUMENTS

CN 102738237 A 10/2012
CN 103429530 A 12/2013

(Continued)

OTHER PUBLICATIONS

Weibmantel et al., "Material Processing: Excimer Lasers Boost Performance of Diamond-Like Carbon Films", Apr. 14, 2010, Laser Focus World, pp. 1-8.*

(Continued)

*Primary Examiner* — Steven H Loke
*Assistant Examiner* — Juanita B Rhodes
(74) *Attorney, Agent, or Firm* — Kinney & Lange, P.A.

(57) ABSTRACT

This present invention discloses a method for preparing graphene, a thin-film transistor, an array substrate, and a display panel. Above all, an amorphous carbon thin film and a catalyst metal thin film are formed on a base substrate in this order. Then, the catalyst metal thin film and the amorphous carbon thin film are allowed to form a eutectic at a high temperature caused by an excimer laser in a manner of excimer laser irradiation. When the irradiation is finished, the surface temperature of the catalyst metal thin film is drastically decreased, allowing most of carbon atoms of the amorphous carbon thin film to be locked in the catalyst metal thin film and only a small amount of carbon atoms to be precipitated on the lower surface of the catalyst metal thin film, so that a graphene thin film is formed. Since the above described the method employs excimer laser irradiation to grow a graphene thin film, and the excimer laser has minor effect on other film layers located under the graphene thin (Continued)

film, graphene can be formed on the base substrate without a transfer process. Therefore, damage and contamination of graphene thin film caused by the transfer process are prevented and properties of graphene thin film are ensured.

11 Claims, 4 Drawing Sheets

(51) Int. Cl.
  H01L 29/66 (2006.01)
  C01B 32/184 (2017.01)
  H01L 21/268 (2006.01)
  H01L 29/786 (2006.01)
  H01L 29/45 (2006.01)
  H01L 29/778 (2006.01)
(52) U.S. Cl.
  CPC .. *H01L 21/02672* (2013.01); *H01L 21/02686* (2013.01); *H01L 29/1606* (2013.01); *H01L 29/45* (2013.01); *H01L 29/66045* (2013.01); *H01L 29/66742* (2013.01); *H01L 29/778* (2013.01); *H01L 29/78633* (2013.01); *H01L 29/78684* (2013.01)
(58) Field of Classification Search
  CPC ......... H01L 21/02686; H01L 21/02672; H01L 29/778; H01L 21/02527; H01L 29/66045; H01L 29/78684; H01L 29/1606; C01B 32/184
  See application file for complete search history.

(56) References Cited

U.S. PATENT DOCUMENTS

| | | | | |
|---|---|---|---|---|
| 2012/0188478 | A1* | 7/2012 | Kuwabara | H01L 29/66742 349/43 |
| 2012/0256167 | A1* | 10/2012 | Heo | H01L 29/1606 257/27 |
| 2013/0161587 | A1* | 6/2013 | Xianyu | H01L 29/66742 257/29 |
| 2013/0341792 | A1* | 12/2013 | Noda | H01L 29/66742 257/741 |
| 2014/0205763 | A1* | 7/2014 | Lu | C01B 32/184 427/530 |
| 2016/0265103 | A1* | 9/2016 | Zhao | C01B 31/0446 |

FOREIGN PATENT DOCUMENTS

| | | |
|---|---|---|
| CN | 103508450 A | 1/2014 |
| JP | 2003263214 A | 9/2003 |
| KR | 100544143 B1 | 11/2005 |

OTHER PUBLICATIONS

English translation of first Office Action dated May 4, 2015, for corresponding Chinese Application No. 20141018434.03.

* cited by examiner

METHOD FOR PREPARING GRAPHENE, THIN-FILM TRANSISTOR, ARRAY SUBSTRATE, AND DISPLAY PANEL

BACKGROUND OF THE INVENTION

Field of the Invention

This invention relates to a technical field of semi-conductors, and specifically to a method for preparing graphene, a thin-film transistor, an array substrate, and a display panel.

Description of the Related Art

Extensive studies on graphene have broken out since single-layer graphene was successfully obtained by a UK physicist, Andre Geim, using a mechanical exfoliation method in 2004. Single-layer graphene is a single-layer hexagonal structure composed of carbon atoms, and has excellent optical, electrical, thermal, and mechanical properties. For example, single-layer graphene has a charge transfer rate of up to about $2\times10^5$ cm$^2$/Vs, which is faster than the charge transfer rate of silicon by 100 times, and has a current density of about $10^8$ A/cm$^2$, which is greater than the current density of copper by 100 times. As a result, single-layer graphene has a significant potential to be used in fields of nanoscale electronic devices, sensor devices, and photoelectric devices.

At present, main manners for preparing single-layer graphene include mechanical exfoliation method, redox method, and chemical vapor deposition (CVD) method. CVD method is a method of forming graphene by adsorbing hydrocarbon gases such as methane, ethylene and the like on the surface of a catalyst metal substrate at a high temperature and performing decomposition and recombination under the catalysis of the metal. Compared to mechanical exfoliation method and redox method, CVD method is able to prepare single-layer graphene with a large area, and thus attracts extra concerns of scientists.

However, CVD method itself has great defects. Generally, CVD method is carried out in a high-temperature furnace, and the grown graphene is completely attached on catalyst metal after growth is finished. An additional transfer step is further required to practically apply the graphene prepared by this method to devices. Transfer typically needs for soaking in FeCl$_3$ solution for more than ten hours to etch off the catalyst metal substrate and then dredging the graphene using a target substrate and drying it. The whole process is time consuming and labor intensive and is not easily controllable. Furthermore, impurities would be introduced, and even damage of graphene would be caused. These impurities and defects directly affect electrical properties of graphene.

Accordingly, the technical problem to achieve a method capable of directly forming graphene on a target substrate is strongly desirable to be solved by those skilled in the art.

SUMMARY OF THE INVENTION

Embodiments of the present invention provide a method for preparing graphene, a thin-film transistor, an array substrate, and a display panel, in which the direct formation of graphene on a target substrate is achieved.

A method for preparing graphene according to an exemplary embodiment of the present invention comprises:

forming an amorphous carbon thin film on a base substrate;

forming a catalyst metal thin film on the amorphous carbon thin film;

irradiating the base substrate with the amorphous carbon thin film and the catalyst metal thin film formed thereon using an excimer laser, so that the amorphous carbon thin film is converted into a graphene thin film under the catalysis of the catalyst metal thin film.

In the above described method for preparing graphene according to the exemplary embodiment of the present invention, above all, an amorphous carbon thin film and a catalyst metal thin film are formed on a base substrate in this order. Then, the catalyst metal thin film and the amorphous carbon thin film are allowed to form a eutectic at a high temperature caused by an excimer laser in a manner of excimer laser irradiation. When the excimer laser irradiation is finished, the surface temperature of the catalyst metal thin film is drastically decreased, allowing most of carbon atoms of the amorphous carbon thin film to be locked in the catalyst metal thin film and only a small amount of carbon atoms to be precipitated on the lower surface of the catalyst metal thin film, so that a graphene thin film is formed. In the above described method for preparing graphene according to the exemplary embodiment of the present invention, since the graphene thin film is grown by irradiating excimer laser which has minor effect on other film layers located under the graphene thin film, the graphene thin film can be formed directly on the base substrate without a transfer process, compared to the prior art wherein a graphene thin film is prepared in a high-temperature furnace and then the graphene thin film is exfoliated from catalyst metal and transferred to a base substrate. Therefore, damage and contamination of graphene thin films caused by the transfer process can be prevented and properties of prepared graphene thin films are ensured.

Preferably, in order to prevent other thin layers located under the amorphous carbon thin film from being affected by excimer laser upon excimer laser irradiation, the above described method according to the exemplary embodiment of the present invention further comprises, before forming the amorphous carbon thin film on the base substrate, forming a buffering layer on the base substrate, wherein the buffering layer is selected from a buffering layer formed by Si$_3$N$_x$, SiO$_2$, or a combination thereof, wherein x is any number of 3 to 4.

Preferably, the above described method according to the exemplary embodiment of the present invention further comprises, after forming the graphene thin film, forming patterns of graphene and catalyst metal by performing patterning on the catalyst metal thin film and the graphene thin film using a first mask plate, wherein the pattern of the graphene and the pattern of the catalyst metal are the same.

Preferably, the above described method according to the exemplary embodiment of the present invention further comprises, after the forming of patterns of graphene and catalyst metal, forming a new pattern of catalyst metal by performing second patterning on the pattern of the catalyst metal using a second mask plate.

Preferably, the above described method according to the exemplary embodiment of the present invention further comprises, after forming the graphene thin film, performing patterning on the catalyst metal thin film and the graphene thin film using a third mask plate, which is a half-tone mask plate or a gray tone mask plate, to form a pattern of catalyst metal at a region of the catalyst metal thin film corresponding to a completely light-shielding region of the third mask plate; and form a pattern of graphene at regions corresponding to a completely light-shielding region and a partly light-shielding region of the third mask plate.

Preferably, in the above described method according to the exemplary embodiment of the present invention, the thickness of the amorphous carbon thin film is 3 nm to 5 nm.

Preferably, in the above described method according to the exemplary embodiment of the present invention, the thickness of the catalyst metal thin film is 100 nm to 300 nm.

A thin-film transistor according to an exemplary embodiment of the present invention comprises a base substrate; an active layer, a gate electrode and a source drain electrode located on the base substrate; wherein a catalyst metal is located on the active layer and at a connection region of the active layer and the source drain electrode; and the material of the active layer is graphene formed by converting amorphous carbon through excimer laser irradiation under catalysis of the catalyst metal.

In the above described thin-film transistor according to the exemplary embodiment of the present invention, the material of the active layer is graphene formed by converting amorphous carbon through excimer laser irradiation under catalysis of the catalyst metal, that is, the active layer of the graphene material is directly formed on a base substrate. Whereas in the prior art, graphene as an active layer is formed by transferring a formed graphene thin film to a base substrate using a transfer process. Therefore, by comparing the above described thin-film transistor to the existing thin-film transistor, problems due to the transfer process of graphene such as damage, contamination, and the like are not prone to occur in the active layer, and thereby properties of the thin-film transistor are improved. Also, as a result of catalyst metal provided on the active layer and at the connection region of the active layer and the source drain electrode, the catalyst metal may protect the active layer from being contaminated by a photoresist in the process of patterning, and thereby properties of the thin-film transistor are further improved. For example, the mobility of a graphene-doped TFT may reach to >1000 cm$^2$/Vs, and the single-layer graphene of the invention has a light transmittance close to 100% and has good mechanical properties suitable for applications in need of flexibility and the like.

Preferably, in the above described thin-film transistor according to the exemplary embodiment of the present invention, the catalyst metal is used as the source drain electrode of the thin-film transistor, or the catalyst metal is electrically connected to the active layer and the source drain electrode of the thin-film transistor, in order to simplify the process of preparation.

Preferably, the above described thin-film transistor according to the exemplary embodiment of the present invention further comprises a buffering layer located directly under the active layer, in order to ensure properties of the active layer.

An array substrate according to an exemplary embodiment of the present invention comprises any one of the above described thin-film transistors according to the exemplary embodiments of the present invention.

A display panel according to an exemplary embodiment of the present invention comprises the above described array substrate according to the exemplary embodiment of the present invention.

DETAILED DESCRIPTION OF PREFERRED EMBODIMENTS OF THE INVENTION

Embodiments of a method for preparing graphene, a thin-film transistor, an array substrate, and a display panel according to exemplary embodiments of the present invention will be described in details below, in conjunction with accompanying drawings.

In the accompanying drawings, the size and the shape do not reflect a true proportional relationship in a thin-film transistor and an array substrate, but they are only an illustrative description of the disclosure of the invention.

Figure 1:
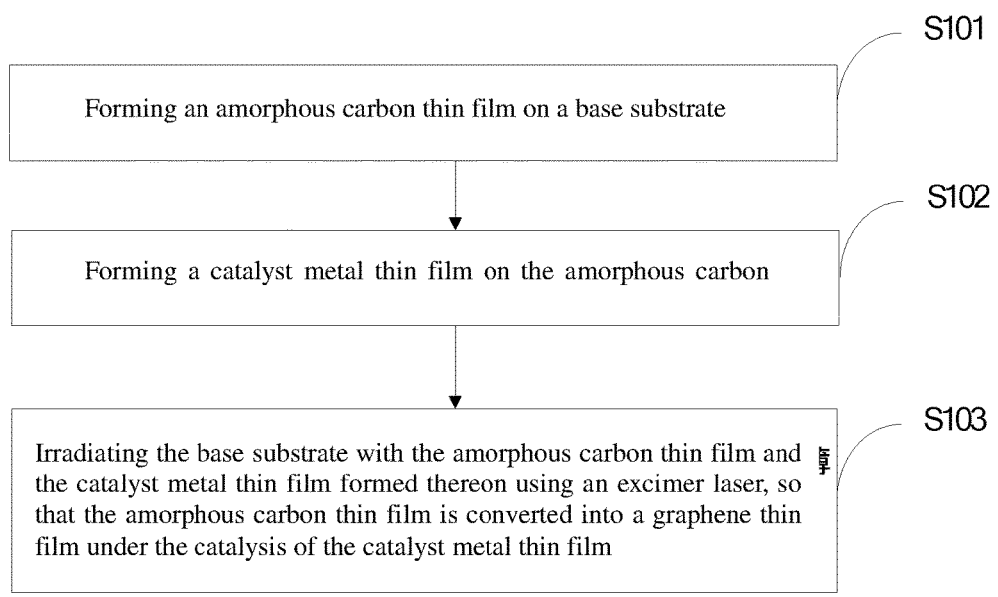
FIG. 1 is a flow chart illustrating a method for preparing graphene according to an exemplary embodiment of the present invention.

As shown in FIG. 1, a method for preparing graphene according to an exemplary embodiment of the present invention may comprise the following steps:

S101, forming an amorphous carbon thin film on a base substrate;

S102, forming a catalyst metal thin film on the amorphous carbon thin film;

S103, irradiating the base substrate with the amorphous carbon thin film and the catalyst metal thin film formed thereon using an excimer laser, so that the amorphous carbon thin film is converted into a graphene thin film under the catalysis of the catalyst metal thin film.

In the above described method for preparing graphene according to the exemplary embodiment of the present invention, above all, an amorphous carbon thin film and a catalyst metal thin film are formed on a base substrate in this order. Then, the catalyst metal thin film and the amorphous carbon thin film are allowed to form a eutectic at a high temperature caused by an excimer laser in a manner of excimer laser irradiation. When the excimer laser irradiation is finished, the surface temperature of the catalyst metal thin film is drastically decreased, allowing most of carbon atoms of the amorphous carbon thin film to be locked in the catalyst metal thin film and only a small amount of carbon atoms to be precipitated on the lower surface of the catalyst metal thin film, so that a graphene thin film is formed. In the above described method for preparing graphene according to the exemplary embodiment of the present invention, since the graphene thin film is grown by irradiating excimer laser which has minor effect on other film layers located under the graphene thin film, the graphene thin film can be formed directly on the base substrate without a transfer process, compared to the prior art wherein a graphene thin film is prepared in a high-temperature furnace and then the graphene thin film is exfoliated from catalyst metal and transferred to a base substrate. Therefore, damage and contamination of graphene thin films caused by the transfer process can be prevented and properties of prepared graphene thin films are ensured.

In Raman spectra of the graphene thin film according to the exemplary embodiment of the present invention, the intensity ratio of 2D peak near 2560 $cm^{-1}$ and peak at 1580 $cm^{-1}$ exceeds 3:1, indicating the formation of a graphene thin film.

It is to be noted that the above described method according to the exemplary embodiment of the present invention may further comprise forming another film layer, which is not defined herein, on the base substrate before forming the amorphous carbon thin film on the base substrate.

Preferably, in order to prevent the base substrate under the graphene thin film from being affected by excimer laser, the above described method according to the exemplary embodiment of the present invention may further comprises the step of firstly forming a buffering layer on the base substrate, before step S101 of forming the amorphous carbon thin film on the base substrate. In this way, as a result that the buffering layer may resist the high temperature caused by excimer laser, the buffering layer functions to protect the base substrate and may further prevent or reduce the reaction or material diffusion between the base substrate and the amorphous carbon as well as the catalyst metal, and thereby it is ensured that the afterward formed graphene thin film is not affected by the base substrate, and the graphene has better electrical properties.

In particular, the graphene thin film prepared using the above described method according to the exemplary embodiment of the present invention may be applied to a touch electrode of a touch screen. In a specific embodiment, a pattern of a touch electrode composed of a pattern of graphene and a pattern of catalyst metal may be formed in a graphene thin film and a catalyst metal thin film by one patterning process. In this way, the pattern of catalyst metal located on the pattern of graphene may not only protect graphene from being contaminated by a photoresist during patterning but also function to decrease the electric resistance of the touch electrode. Of course, in the specific embodiment, in order to reduce the thickness of the touch electrode, when preparing the touch electrode, the pattern of catalyst metal located on the pattern of graphene may be etched off after the pattern of graphene is produced, or the catalyst metal thin film is etched off and then the pattern of graphene is formed by patterning process. However, both of the methods may add one etching process. The touch electrode is exemplified for illustration herein, and the invention is not restricted thereto.

Figure 2A:
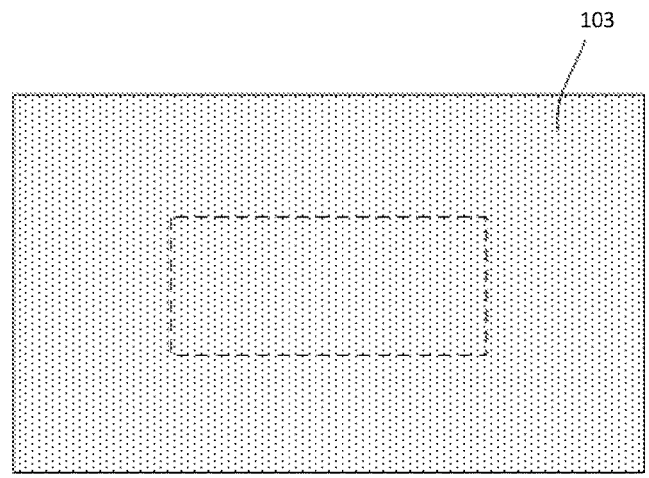
FIG. 2a is an illustrative structure view of a base substrate formed with a graphene thin film according to an exemplary embodiment of the present invention.
Figure 2B:
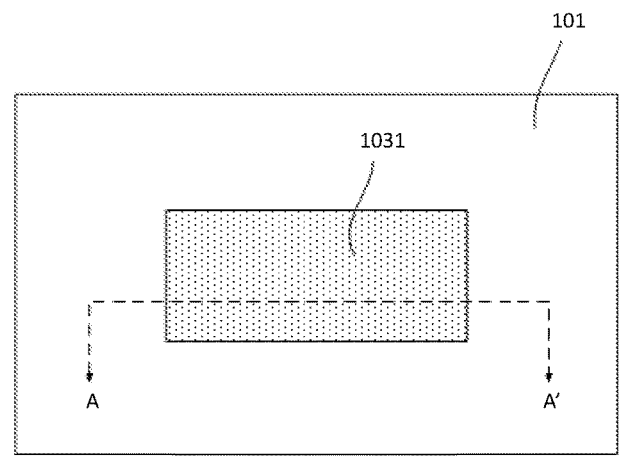
FIG. 2b is an illustrative structure view of a base substrate after patterning via a first mask plate.
Figure 2C:
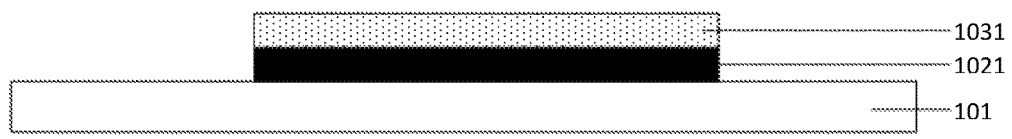
FIG. 2c is an illustrative sectional view of FIG. 2b along a direction of A-A'.

A touch electrode produced using the graphene thin film prepared by the above described method according to the exemplary embodiment of the present invention is exemplified below for description. In the above described method according to the exemplary embodiment of the present invention, after step S103 of forming the graphene thin film, the method may further comprise the following steps:

as shown in FIG. 2a, a graphene thin film and a catalyst metal thin film 103 located on a base substrate 101 in this order are patterned using a first mask plate to form patterns of graphene and catalyst metal, wherein the dashed line in FIG. 2a indicates a pattern of graphene and a pattern of catalyst metal to be formed after patterning. In particular, as shown in FIG. 2b and FIG. 2c, the graphene pattern 1021 and the catalyst metal pattern 1031 are the same, wherein FIG. 2b is a top view of the graphene pattern 1021 and the catalyst metal pattern 1031, and FIG. 2c is an illustrative sectional view of FIG. 2b along a direction of A-A'.

Figure 2D:
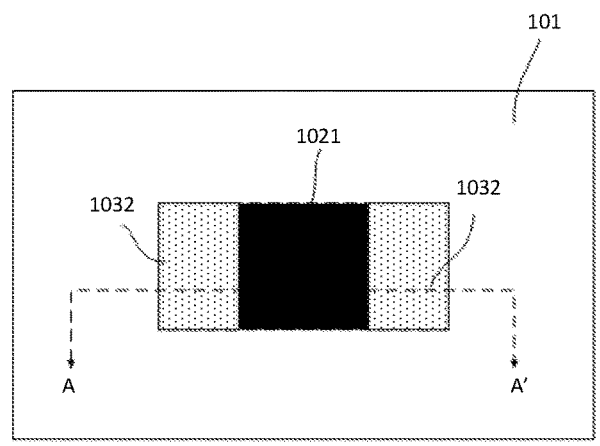
FIG. 2d is an illustrative structure view of a base substrate after patterning via a second mask plate.
Figure 2E:
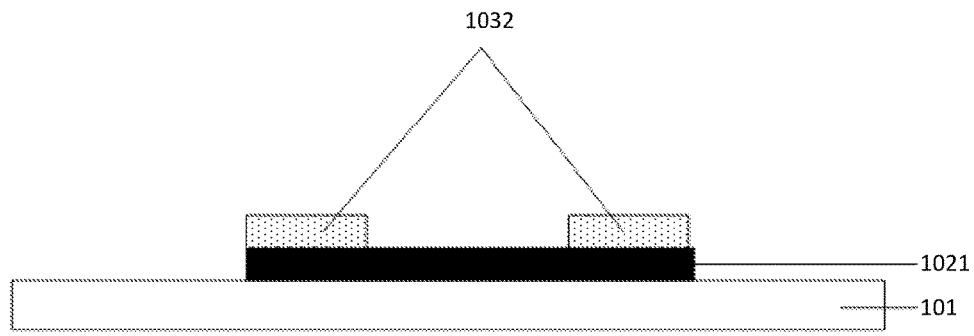
FIG. 2e is an illustrative sectional view of FIG. 2d along a direction of A-A'.

Furthermore, the graphene thin film prepared using the above described method according to the exemplary embodiment of the present invention may further be applied to a thin-film transistor. In particular, in a specific embodiment, after forming the patterns of graphene and catalyst metal, the catalyst metal pattern 1031 as shown in FIG. 2b is subject to a second patterning by using a second mask plate, to form a new catalyst metal pattern 1032 as shown in FIGS. 2d and 2e, wherein FIG. 2e is an illustrative sectional view of FIG. 2d along a direction of A-A'. Wherein, the graphene pattern 1021 may be a pattern of an active layer in the thin-film transistor, the new catalyst metal pattern 1032 may be a pattern of a source drain electrode in the thin-film transistor, and so on. It is to be noted that the application to a thin-film transistor is only exemplified for illustration herein, and the invention is not restricted thereto.

In particular, the case where the graphene thin film prepared using the above described method according to the exemplary embodiment of the present invention is applied to a thin-film transistor is exemplified for illustration. Preferably, after forming the graphene thin film, the above described preparation method may further comprises a step of performing patterning on the catalyst metal thin film and the graphene thin film directly using a third mask plate, which is a half-tone mask plate or a gray tone mask plate, to form a catalyst metal pattern (i,e, a pattern of a source drain electrode in the thin-film transistor) at a region of the catalyst metal thin film corresponding to a completely light-shielding region of the third mask plate; and to form a graphene pattern (i,e, a pattern of an active layer in the thin-film transistor) at regions corresponding to a completely light-shielding region and a partly light-shielding region of the third mask plate. Compared to forming a pattern of a source drain electrode and forming a pattern of an active layer by two patterning processes, this method may omit one patterning process and thereby production cost may be saved. It is to be noted that the application to a thin-film transistor is only exemplified for illustration herein, and the invention is not restricted thereto.

Preferably, in the above described method according to the exemplary embodiment of the present invention, the thickness of the amorphous carbon (a-C) thin film is controlled to 3 nm-5 nm, but the invention is not limited thereto.

Preferably, in the above described method according to the exemplary embodiment of the present invention, the thickness of a catalyst metal thin film is controlled to 100 nm-300 nm, but the invention is not limited thereto.

Furthermore, in the above described method according to the exemplary embodiment of the present invention, the catalyst metal may be one of nickel (Ni), copper (Cu), cobalt (Co), and platinum (Pt) or a combination thereof, but the invention is not limited thereto. In particular, the catalyst metal may be formed by a method of evaporation, sputtering, chemical vapor deposition, or atom layer deposition, but the invention is not limited thereto.

Furthermore, in the above described method according to the exemplary embodiment of the present invention, the base substrate is a carrier for depositing graphene and eventually forming an array structure, and is preferably a glass substrate in an exemplary embodiment of the present invention.

Furthermore, in the above described method according to the exemplary embodiment of the present invention, the buffering layer is generally a layer of $Si_3N_x$, $SiO_2$, or a combination thereof formed by plasma enhanced chemical vapor deposition (PECVD), wherein x is an integer of 3 to 4.

Figure 3A:
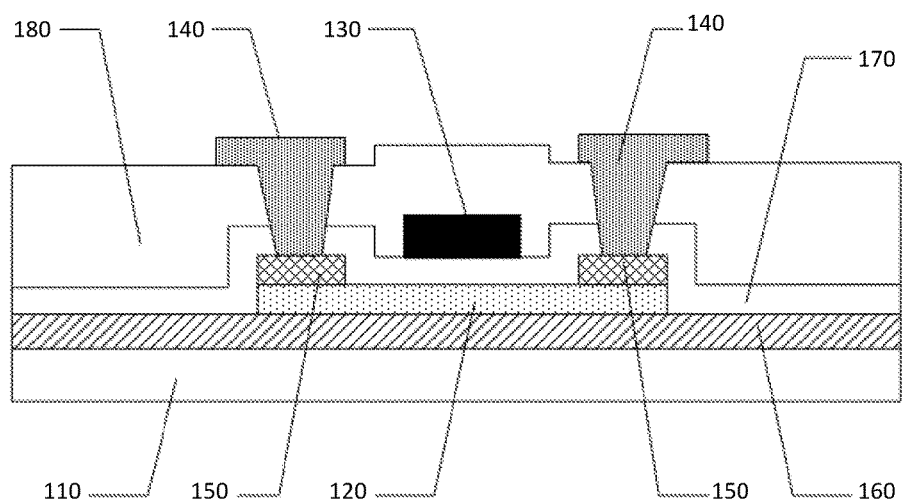
FIG. 3a and FIG. 3b are illustrative structure views of thin-film transistors according to exemplary embodiments of the present invention, respectively.
Figure 3B:
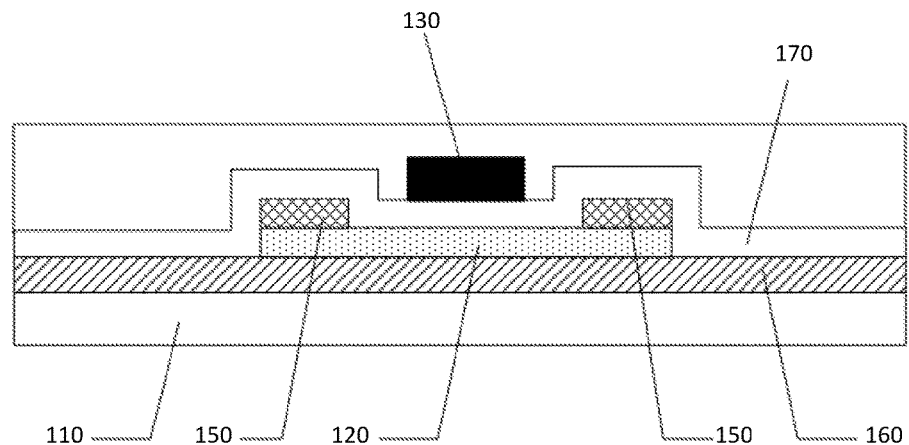

Based on the same inventive concept, an exemplary embodiment of the present invention further provides a thin-film transistor comprising, as shown in FIGS. 3a and FIG. 3b, a base substrate 110, and an active layer 120, a gate electrode 130, and a source drain electrode 140 located on the base substrate 110; and a catalyst metal 150 located on the active layer 120 and at a connection region of the active layer 120 and the source drain electrode 140; wherein the material of the active layer 120 is graphene formed by converting amorphous carbon through excimer laser irradiation under catalysis of the catalyst metal.

Preferably, conditions for forming graphene in the exemplary embodiment of the present invention are as follows: Laser energy 700 mj/500 Hz, Scanning pitch: 14 μm, overlap: 96%, irradiation energy density of laser: 410 mJ/cm$^2$, N2≤100 ppm. The mobility of the prepared graphene-doped TFT may reach to 1000 cm$^2$/Vs. The light transmittance of a single-layer graphene is about 97%.

In the above described thin-film transistor according to the exemplary embodiment of the present invention, the material of the active layer is graphene formed by converting amorphous carbon through excimer laser irradiation under catalysis of the catalyst metal, that is to say, the active layer of the graphene material is directly formed on the base substrate. Whereas in the prior art, graphene as an active layer is formed by transferring a formed graphene thin film to a base substrate using a transfer process. Therefore, by comparing the above described thin-film transistor and an existing thin-film transistor, problems that the graphene is prone to be damaged, contaminated due to the transfer process of graphene and the like do not occur in the active layer, and thereby properties of the thin-film transistor are improved. Also, as a result of catalyst metal provided on the active layer and at a connection region of the active layer and the source drain electrode, the catalyst metal may protect the active layer from being contaminated by a photoresist in the process of patterning, and thereby properties of the thin-film transistor are further improved.

It is to be noted that the above described thin-film transistor according to the exemplary embodiment of the present invention may be a top gate type structure or may be a bottom gate type structure, which are not specified herein.

Preferably, in the above described thin-film transistor according to the exemplary embodiment of the present invention, catalyst metal 150 may be used as the source drain electrode 140 of the thin-film transistor in order to simplify the process of preparation, as shown in FIG. 3b. In this way, the catalyst metal may play a role of catalysis when preparing the active layer and may also be used as a source drain electrode by patterning.

In particular, in the above described thin-film transistor according to the exemplary embodiment of the present invention, when the catalyst metal 150 is used as the source drain electrode 140 of the thin-film transistor, the thin-film transistor may be a top gate type structure where the gate electrode 130 may be located above the source drain electrode 140 as shown in FIG. 3b. Of course, the thin-film transistor may also be a bottom gate type structure, that is, the gate electrode is located under the active layer, which is not specified herein.

Or preferably, in the above described thin-film transistor according to the exemplary embodiment of the present invention, the catalyst metal 150 may be electrically connected to the active layer 120 and the source drain electrode 140 of the thin-film transistor, as shown in FIG. 3a. In this way, the catalyst metal 150 located above the active layer 120 may play a role of protective effect on the active layer 120. This is because the source drain electrode 140 located above the active layer 120 is electrically connected to the active layer 120 by a via hole, whereas the via hole is generally prepared by an etching process, and thus the active layer 120 located at the via hole may be etched when etching the via hole, so that properties of the thin-film transistor are affected.

In particular, in the above described thin-film transistor according to the exemplary embodiment of the present invention, when the catalyst metal 150 is electrically connected to the active layer 120 and the source drain electrode 140 of the thin-film transistor, the thin-film transistor may be a top gate type structure where the gate electrode 130 may be located above the source drain electrode 140 as shown in FIG. 3a. Of course, the thin-film transistor may also be a bottom gate type structure, that is, the gate electrode is located under the active layer, which is not specified herein.

Furthermore, when the above described thin-film transistor according to the exemplary embodiment of the present invention is a top gate type structure and the catalyst metal 150 is electrically connected to the active layer 120 and the source drain electrode 140 of the thin-film transistor, the above described thin-film transistor may further comprise a dielectric layer 180 between the gate electrode 130 and the source drain electrode 140, where the source drain electrode 140 is electrically connected to the catalyst metal 150 by a via hole through the dielectric layer 180, as shown in FIG. 3a.

Preferably, in order to ensure electrical properties of the active layer, the above described thin-film transistor according to the exemplary embodiment of the present invention may further comprise a buffering layer 160 located directly under the active layer 120 as shown in FIG. 3a and FIG. 3b. By providing the buffering layer 160 under the active layer 120, reaction or material diffusion between materials for preparing the active layer and other film layer(s) under the active layer when preparing the active layer can be prevented or reduced, and thereby it is ensured that properties of the formed active layer of graphene material are not affected.

In particular, in the above described thin-film transistor according to the exemplary embodiment of the present invention, the thin-film transistor is a top gate type structure and it further comprises a gate insulation layer 170 between the gate electrode 130 and the active layer 120, as shown in FIG. 3a and FIG. 3b.

Based on the same inventive concept, an exemplary embodiment of the present invention further provides an array substrate comprising the above described thin-film transistor according to the exemplary embodiment of the present invention. The exemplary embodiment of the array substrate can be seen from the exemplary embodiment of the above described thin-film transistor, and repeated contents are omitted.

In particular, the above described array substrate according to the embodiment of the invention may be applied to a liquid crystal display panel, and of course may also be applied to an organic electroluminescent display panel, but the invention is not limited thereto.

Figure 4:
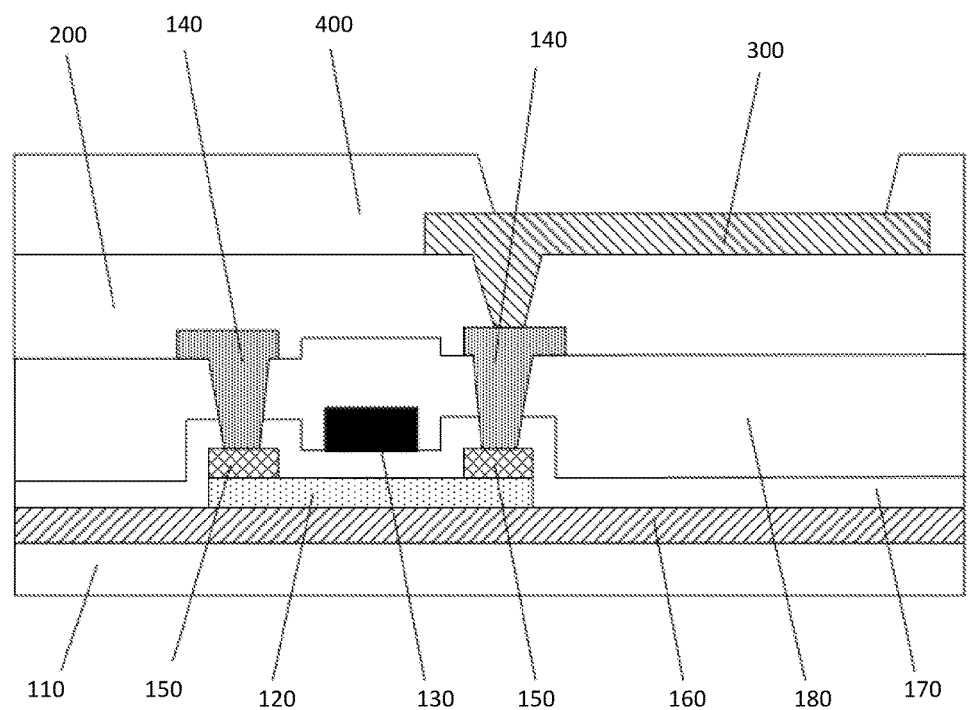
FIG. 4 is an illustrative structure view of an array substrate according to an exemplary embodiment of the present invention.

In a specific embodiment, the array substrate according to the exemplary embodiment of the present invention may specifically comprises an over coating 200 covering the thin-film transistor 100 and a pixel electrode 300 located on the over coating 200, wherein the pixel electrode 300 is electrically connected to the drain electrode in the source drain electrode 140 by a via hole through the over coating 200, as shown in FIG. 4.

Furthermore, when the above described array substrate is applied to an organic electroluminescent display panel, the above described array substrate may further comprise a bounding layer 400 on the pixel electrode 300, as shown in FIG. 4.

In the method for preparing graphene, the thin-film transistor, the array substrate, and the display panel according to the exemplary embodiment of the present invention, above all, an amorphous carbon thin film and a catalyst metal thin film are formed on a base substrate in this order. Then, the catalyst metal thin film and the amorphous carbon thin film are allowed to form a eutectic at a high temperature caused by an excimer laser in a manner of excimer laser irradiation. When the excimer laser irradiation is finished, the surface temperature of the catalyst metal thin film is drastically decreased, allowing most of carbon atoms of the amorphous carbon thin film to be locked in the catalyst metal thin film and only a small amount of carbon atoms to be precipitated on the lower surface of the catalyst metal thin film, so that a graphene thin film is formed. In the above described method for preparing graphene according to the exemplary embodiment of the present invention, since excimer laser irradiation is employed to a graphene thin film is grown by irradiating an excimer laser which has minor effect on other film layer(s) located under the graphene thin film, a graphene thin film can be formed directly on the base substrate without transfer process, compared to the prior art wherein a graphene thin film is prepared in a high-temperature furnace and then the graphene thin film is exfoliated from catalyst metal and transferred to a base substrate. Therefore, damage and contamination of graphene thin films caused by the transfer process can be prevented and properties of prepared graphene thin films are ensured.

It will be obvious that various modifications and variations of the invention may be made by the person skilled in the art without deviating from the spirit and scope of the invention. Therefore, if these modifications and variations of the invention are within the scope of claims of the invention and equivalent techniques thereof, it is intended that the invention comprises these modifications and variations.

What is claimed is:

1. A method for preparing a thin-film transistor comprising a base substrate; an active layer, a gate electrode, and a source/drain electrode located on the base substrate,
   wherein the method comprises directly forming graphene on the base substrate of the thin-film transistor, said directly forming graphene on the base substrate of the thin-film transistor comprising:
   forming an amorphous carbon thin film on the base substrate;
   forming a catalyst metal thin film on the amorphous carbon thin film; and
   irradiating the base substrate with the amorphous carbon thin film and the catalyst metal thin film formed thereon using an excimer laser, so that the amorphous carbon thin film is converted into a graphene thin film under a catalysis of the catalyst metal thin film,
   wherein the graphene thin film is used as a material of the active layer, and
   wherein the catalyst metal thin film located on the active layer and at a connection region of the active layer is used as the source/drain electrode, or is electrically connected to the active layer and the source/drain electrode.

2. The method according to claim 1, wherein a catalyst metal of the catalyst metal thin film is one or a combination of two or more of nickel, copper, cobalt, and platinum.

3. The method according to claim 1, wherein after forming the graphene thin film, the method further comprises:
   forming patterns of graphene and catalyst metal by performing patterning on the catalyst metal thin film and the graphene thin film using a first mask plate, wherein the pattern of the graphene and the pattern of the catalyst metal are the same.

4. The method according to claim 3, wherein after forming the patterns of graphene and catalyst metal, the method further comprises:
   forming a new pattern of the catalyst metal by performing a second patterning process on the pattern of the catalyst metal using a second mask plate.

5. The method according to claim 1, wherein after forming the graphene thin film, the method further comprises:
   performing patterning on the catalyst metal thin film and the graphene thin film using a mask plate, which is a half-tone mask plate or a gray tone mask plate, to form a pattern of catalyst metal at a region of the catalyst metal thin film corresponding to a completely light-shielding region of the mask plate having the half-tone mask plate or the gray tone mask plate, and to form a pattern of graphene at regions of the graphene thin film corresponding to the completely light-shielding region and a partly light-shielding region of the mask plate having the half-tone mask plate or the gray tone mask plate.

6. The method according to claim 1, wherein forming the amorphous carbon thin film on the base substrate comprises forming the amorphous carbon thin film with a thickness of 3 nm to 5 nm.

7. The method according to claim 3, wherein forming the amorphous carbon thin film on the base substrate comprises forming the amorphous carbon thin film with a thickness of 3 nm to 5 nm.

8. The method according to claim 5, wherein forming the amorphous carbon thin film on the base substrate comprises forming the amorphous carbon thin film with a thickness of 3 nm to 5 nm.

9. The method according to claim 1, wherein a thickness of the catalyst metal thin film is 100nm to 300nm.

10. The method according to claim 3, wherein a thickness of the catalyst metal thin film is 100nm to 300nm.

11. The method according to claim 5, wherein a thickness of the catalyst metal thin film is 100nm to 300nm.

* * * * *